(12) United States Patent
Hu

(10) Patent No.: US 7,674,362 B2
(45) Date of Patent: Mar. 9, 2010

(54) METHOD FOR FABRICATION OF A CONDUCTIVE BUMP STRUCTURE OF A CIRCUIT BOARD

(75) Inventor: Wen-Hung Hu, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 69 days.

(21) Appl. No.: 12/061,200

(22) Filed: Apr. 2, 2008

(65) Prior Publication Data

US 2008/0179190 A1    Jul. 31, 2008

Related U.S. Application Data

(62) Division of application No. 11/370,724, filed on Mar. 7, 2006, now abandoned.

(30) Foreign Application Priority Data

Mar. 9, 2005    (TW) ............................ 94107081 A

(51) Int. Cl.
C25D 17/00 (2006.01)
(52) U.S. Cl. ................... 205/125; 205/222; 438/613
(58) Field of Classification Search ............... 205/125, 205/159, 164, 183, 220, 222, 223; 438/613
See application file for complete search history.

(56) References Cited

U.S. PATENT DOCUMENTS

| 2,728,693 A | 12/1955 | Cado |
| 3,986,255 A | 10/1976 | Mandal |
| 4,893,404 A | 1/1990 | Shirahata et al. |
| 5,435,480 A | 7/1995 | Hart et al. |
| 5,545,308 A | 8/1996 | Murphy et al. |
| 5,662,987 A | 9/1997 | Mizumoto et al. |
| 5,869,899 A | 2/1999 | Arledge et al. |
| 5,956,843 A | 9/1999 | Mizumoto et al. |
| 6,013,713 A | 1/2000 | Cotte et al. |
| 6,365,843 B1 | 4/2002 | Shirai et al. |
| 7,071,424 B1 | 7/2006 | Shirai et al. |
| 7,216,424 B2 | 5/2007 | Wang |
| 2006/0009026 A1* | 1/2006 | Sawaguchi et al. .......... 438/622 |
| 2006/0219567 A1* | 10/2006 | Hu .............................. 205/125 |

* cited by examiner

*Primary Examiner*—Nam X Nguyen
*Assistant Examiner*—Luan V Van
(74) *Attorney, Agent, or Firm*—Sawyer Law Group, P.C.

(57) ABSTRACT

A method for fabricating a conductive bump structure of a circuit board is disclosed. The circuit board with a plurality of electrical connection pads is provided. An insulating protective layer and a resist layer are successively applied on the circuit board, wherein openings are formed in the layers at positions corresponding to the pads to expose the pads. Then, a conductive layer is formed on surfaces of the resist layer and openings, and a metal layer is formed on the conductive layer via electroplating and filled in the openings. Subsequently, the metal layer and conductive layer formed on the resist layer are removed via thinning, so as to form metal bumps on the pads. After the resist layer is removed, the metal bumps are covered by an adhesive layer to form a conductive bump structure for electrically connecting the circuit board to the external electronic component.

19 Claims, 8 Drawing Sheets

METHOD FOR FABRICATION OF A CONDUCTIVE BUMP STRUCTURE OF A CIRCUIT BOARD

CROSS-REFERENCE TO RELATED APPLICATIONS

This application is a divisional application and claims benefit of priority under 35 USC § 121 of U.S. patent application Ser. No. 11/370,724, filed Mar. 7, 2006, and under 35 USC 119 of Taiwan Application No. 094107081, filed on Mar. 9, 2005, all of which is incorporated herein by reference.

FIELD OF THE INVENTION

The present invention relates to a method for fabricating a conductive bump structure of a circuit board, and more particularly, to a conductive bump structure formed on an electrical connection pad of a circuit board for electrically connecting the circuit board to the external electronic component.

BACKGROUND OF THE INVENTION

The flip chip packaging technology was introduced by IBM in the early 1960s, and this technology differs from the wire bonding technology in that the electrical connectivity between the semiconductor chip and the substrate is achieved by the solder bumps instead of the ordinary wires. The main advantage of the flip chip packaging technology lies in its capability of elevating packaging density, thus the size of the packaged components are reduced; on the other hand, the flip chip packaging technology does not require wires of longer length, and hence the electrical functionality can be improved. As a result, the industry has been employing high-temperature soldering on ceramic substrates for years, and this technology is termed as control-collapse chip connection or 4C technology. Because the demand for semiconductor components of high-density, high-speed, low-cost has increased dramatically, and a trend that calls for smaller electronic products has emerged; it has become common to place the flip chip components on a low-cost organic circuit board (for example, a printed circuit board or a substrate board), then followed by the filling of epoxy underfill resin underneath the chip in order to minimize the thermal stress resulted from the differences in thermal expansion between silicon chip and organic circuit board structure, and the phenomenon has grown exponentially.

In the current flip chip packaging technology, the surface of semiconductor integrated circuit chip is disposed an electrode pad thereof, and its corresponding connecting pads are disposed on the organic circuit board; solder bumps or other conductive solder materials are filled between the chip and the circuit board, so that the chip is disposed on the circuit board with its electrical connecting side facing downwards. The solder bumps or the conductive adhesive materials used in this technology provides for the electrical input and output, as well as the mechanical connection between the chip and the circuit board.

As shown in FIG. 1, in the flip chip packaging technology, a plurality of metal bumps 11 are formed on electrode pads 12 of a chip 13, and a plurality of preset solder bumps 14 made of solder are formed on electrical connection pads 15 of a circuit board 16, then solder joint 17 are formed by reflowing preset solder bumps 14 to the corresponding metal bumps 11 under the condition of having the temperature sufficient for melting the preset solder bumps 14. In the next step, the chip and the circuit board are coupled by using the underfill material 18, so that the integration and the reliability of the electrical connection between chip 13 and circuit board 16 can be ensured.

Moreover, when the circuit board and the semiconductor chip are to be packaged, a plurality of solder balls are required to be implanted on the bottom surface of the circuit board, so that it is possible for the circuit board to electrically connect to external electronic devices. In order to allow the solder balls to connect to the circuit board effectively, the electrical connection pads of the circuit board that are to be used for the disposition of solder balls must be formed with the solder materials for connecting the solder balls first.

Currently, the method that is most commonly used to form solder material on the electrical connection pad of the circuit board is the stencil printing technology. As shown in FIG. 2, a solder-mask layer 21 is formed on a circuit board 20 that has been wired with circuits, then a plurality of electrical connection pads 22 are exposed, so that a stencil 23 with a plurality of openings 23a are placed on the solder-mask layer 21 of the circuit board 20; solder deposition can be formed on the electrical connection pads 22 by the openings 23a (not shown in the figure). A roller 24 or spray mode can be utilized to allow the solder to accumulate in the openings 23a, and once stencil 23 is removed, the solder deposition is formed in the openings 23a. This is followed by the reflowing process, which allows the solder deposition on the electrical connection pads 22 to solidify into the solder structure.

However, the developmental trend of miniaturization for semiconductor chip is driving changes in the semiconductor packaging technology, in order to allow the ever-shrinking chips to have more input and output terminals. But the change also shrinks the total area of carried components in a chip, which in turn increases the quantity of electrical connection pad on the carried components; as a result, the demands for the development of chip can only be satisfied by shrinking the size and the pitch of electrical connection pad. But the shrinking of electrical connection pad also makes the openings on the stencil used in stencil printing technology smaller as well. As a result, the smaller openings on the stencil not only increases the cost for producing the stencil, which is resulted from difficulty in stencil production; but also hampers the later production process because the smaller opening on the stencil can be impervious to the solder material. Furthermore, apart from the requirement of accurate size of stencil in order to ensure the precision in the shaping of solder material; there are the problems of the number of times the stencil has been used and cleaned. Since the solder material is viscous, it can stick to the inner wall of openings in the stencil and accumulate as the stencil is used to print many times, and this can give rise to incorrect quantity and shape of solder material from the design specification when the stencil is used next time. Therefore, when the stencil is put to actual usage, it must be cleaned after a certain times of printing, otherwise problems like conflicting shape and size of solder material can arise and result in the production process being impeded, which lowers its reliability.

To solve the above disadvantages, the method of electroplating has been employed to form solder material on the circuit board. FIGS. 3A to 3D are figures showing the procedural steps in the method for electroplating preset solder bumps on the circuit board. As shown in FIG. 3A, a solder mask layer 31 is formed on the circuit board 30 that has electrical connection pads 300, then openings 310 are formed on the solder mask layer 31 to expose the electrical connection pads 300 of the circuit board 30. As shown in FIG. 3B, a conductive layer 32 is formed on the surface of solder mask layer 31 and its openings 310, then an electroplated resist layer 33 that is to be electroplated and formed with openings 330 is formed on the conductive layer 32, so that the conductive layer 32 covered on the electrical connection pads 300 is exposed. As shown in FIG. 3C, the electroplating process is carried out, which utilizes the conductivity of conductive layer 32 as the electrically conductive pathway during electroplating, so that solder material 34 is formed by electroplating in the openings 330 that are to be electroplated. As shown in FIG. 3D, the resist layer 33 and the portion of the conductive layer 32 covered by the resist layer 33 are removed, then followed by solder reflowing so that preset solder bumps 35 are formed on the electrical connection pads of the circuit board.

Although the above procedures can solve the problems of stencil printing described previously, the difficulty of electroplating can be increased due to minimal area for electroplating, because solder materials 34 is formed in the openings of resist layer by direct electroplating. Moreover, when solder material is formed on the electrical connection pads in the openings of solder mask layer by direct electroplating, it becomes difficult to control the height of solder material on the electrical connection pads, which can lead to problems like uneven height of conductive bumps on the surface of circuit board, and this will have serious impact on the reliability of the electrical connecting process of later circuit boards and external electronic components (especially semiconductor chips).

SUMMARY OF THE INVENTION

In light of the above prior art drawbacks, a primary objective of the present invention is to provide a conductive bump structure of the circuit board and a method for fabricating the same to avoid problems related to formation of conductive bumps of uneven height on a surface of the circuit board, so as to ensure the reliability of the subsequent electrical connecting process for circuit boards and external electronic components.

Another objective of the present invention is to provide a conductive bump structure of the circuit board and a method for fabricating the same to avoid problems such as having the difficulty of electroplating increased due to minimal area for electroplating.

Still another objective of the present invention is to provide a conductive bump structure of the circuit board and a method for fabricating the same to reduce the amount of solder materials used and the cost of production.

A further objective of the present invention is to provide a conductive bump structure of the circuit board and a method for fabricating the same to effectively form conductive bumps serving as external electrical connections on fine-pitch electrical connection pads of the circuit board.

Yet another objective of the present invention is to provide a conductive bump structure of the circuit board and a method for fabricating the same to prevent restrictions on size of conductive bumps, an increase in production cost or complexity of fabrication process.

In accordance with the foregoing and other objectives, the present invention proposes a method for fabricating a conductive bump structure of the circuit board, comprising steps of: providing the circuit board having at least a surface formed with a plurality of electrical connection pads; forming an insulating protective layer and a resist layer on the circuit board in sequence; forming a plurality of openings in the insulating protective layer and resist layer at positions corresponding to the electrical connection pads to expose the electrical connection pads of the circuit board; forming a conductive layer on surfaces of the resist layer and openings; forming a metal layer on the conductive layer via electroplating, and filling the metal layer in the openings of the insulating protective layer and resist layer; removing the metal layer and conductive layer formed on the surface of the resist layer via thinning, and retaining the metal layer and conductive layer filled in the openings to form metal bumps on the electrical connection pads; and removing the resist layer via chemical etching or physical tearing, and forming an adhesive layer over exposed surfaces of the metal bumps, so as to form the conductive bump structure for electrically connecting the circuit board to the external electronic component. Further, the metal layer may be made of a material selected from the group consisting of copper (Cu), tin (Sn), lead (Pb), silver (Ag), and their alloys; the adhesive layer may be made of a material selected from the group consisting of copper (Cu), tin (Sn), lead (Pb), silver (Ag), nickel (Ni), gold (Au), platinum (Pt) and their alloys, or be an organic solderability preservative (OSP).

In another preferred embodiment, the present invention proposes a method for fabricating a conductive bump structure of the circuit board, comprising steps of: providing the circuit board having at least a surface formed with a plurality of electrical connection pads; forming an insulating protective layer on the circuit board in sequence, and forming a plurality of openings in the insulating protective layer to expose the electrical connection pads of the circuit board; forming a resist layer on the insulating protective layer, and forming a plurality of openings in the resist layer at positions corresponding to the openings of the insulating protective layer to expose the electrical connection pads; forming a conductive layer on exposed surfaces of the resist layer and openings; forming a metal layer on the conductive layer via electroplating, and filling the metal layer in the openings; removing the resist layer, the conductive layer and metal layer formed on the surface of the resist layer via chemical etching or physical tearing so as to form metal bumps on the electrical connection pads of the circuit board, wherein the metal bumps comprise the metal layer and conductive layer; and forming an adhesive layer over exposed surfaces of the metal bumps. Furthermore, the insulating protective layer can be previously formed with a plurality of openings to expose the electrical connection pads on the surface of the circuit board. Then, the resist layer formed on the insulating protective layer with a plurality of openings located at positions corresponding to the electrical connection pads. However, the insulating protective layer and resist layer may be successively formed first, before forming the openings of the insulating protective layer and resist layer at the same time.

Referring to the aforementioned fabricating methods, a conductive bump structure of the circuit board fabricated in accordance with present invention is provided, wherein a surface of the circuit board is formed with an electrical connection pad and covered by an insulating protective layer, an opening is formed in the insulating protective layer to expose the electrical connection pad covered by the insulating protective layer and the conductive bump structure is formed on the electrical connection pad of the circuit board and protruded from the opening of the insulating protective layer. Further, the conductive bump structure comprises a metal bump having a metal layer and a conductive layer formed on the lateral and bottom sides of the metal layer, wherein the metal bump is protruded from the opening of the insulating layer; and an adhesive layer covering the exposed surface of the metal bump.

Therefore, according to a conductive bump structure of the circuit board and a method for fabricating the same provided in the present invention, an insulating layer and a resist layer with openings are formed on a surface of a circuit board, wherein the openings are corresponding to electrical connection pads, so that the electrical connection pads are exposed. Then a conductive layer is formed on the surfaces of the openings and resist layer. This thereby allows the conductive layer with larger surface area to provide a sufficiently large area for subsequent electroplating process and form a metal layer thereon by electroplating. Later, the metal layer and the conductive layer formed on a surface of the resist layer are removed, so as to reduce the difficulty of electroplating increased due to minimal area for electroplating. Further, the metal layer is filled in the openings of the insulating protective layer and the resist layer in order to flatten the surface of the metal layer; and then a portion of the metal layer is removed to form the metal bumps of even height, so as to avoid problems like forming uneven height of conductive bumps on the surface of circuit board, which is incurred as a result of directly forming the metal bumps in the openings of the insulating protective layer and the resist layer by electroplating and will have a serious impact on the reliability of the electrical connecting process of circuit boards and external electronic components (including semiconductor chips).

Moreover, in accordance with a conductive bump structure of the circuit board and a method for fabricating the same provided in the present invention, the conductive layer is formed on surfaces of the electrical connection pads first, and then the metal layer is formed on the conductive layer of larger surface area via electroplating. Accordingly, the metal layer formed on the electrical connection pads via copper electroplating, having a low material cost and faster electroplating speed, is made with copper characteristics to save the fabrication time. Further, the difficulty of electroplating is reduced because of having a larger surface area of the conductive layer for electroplating. As a result, the conductive bump structure of the circuit provided in the present invention could reduce the amount of solder material used and thus reduce the cost of production. Meanwhile, the present invention could also avoid problems such as bridging effect and short circuit, resulting from using too much solder materials in the conventional solder reflow process; and hence provide the fine-pitch electrical connection pads and solve problems caused by the conventional stencil printing technique, such as size limitation on conductive bumps, restrictions on distances between contact pads or increase of production cost and complexity of fabrication.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The present invention relates generally to a method for fabricating conductive bump structure of a circuit board, and more particularly, to a conductive bump structure formed on an electrical connection pad of a circuit board for electrically connecting the circuit board to the external electronic component. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Proposed in the present invention can be more fully understood by reading the detailed description of the preferred embodiments. What needs to be concerned here is that the drawings are simplified schematic diagrams, and thus only constructs relevant to the present invention are illustrated.

FIGS. 4A-4I show a preferred embodiment of a conductive bump structure of a circuit board of the present invention and the method of making the same.

Figure 1:
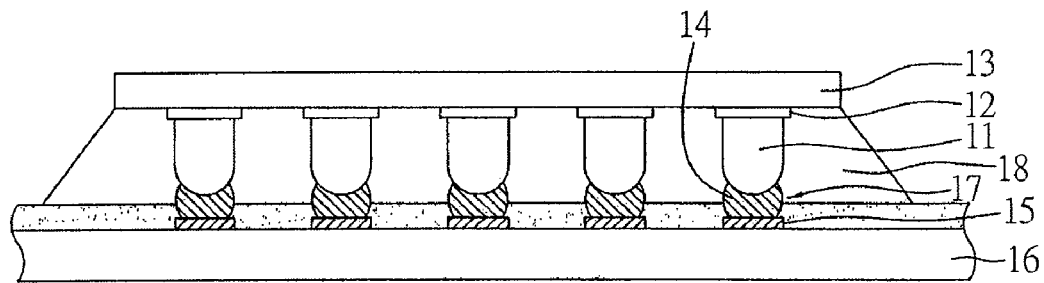
FIG. 1 (PRIOR ART) IS a cross-sectional schematic diagram of a conventional flip-chip component.
Figure 2:
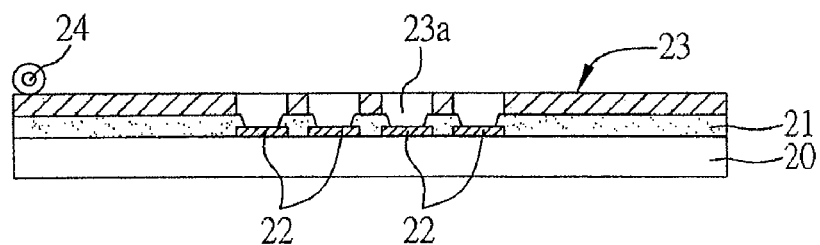
FIG. 2 (PRIOR ART) is a cross-sectional schematic diagram of a conventional circuit board having solder material deposited on electrical connection pads via stencil printing technology.
Figure 3A:
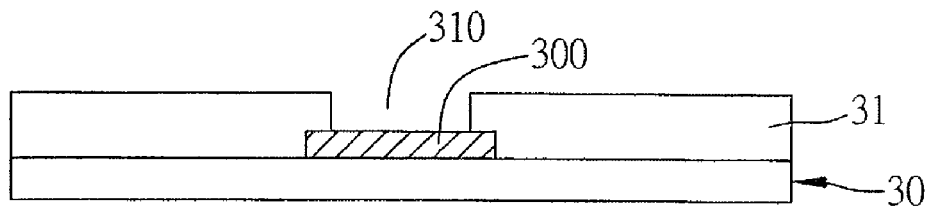
FIGS. 3A to 3D (PRIOR ART) are cross-sectional schematic diagrams of a conventional pre-soldering bump of the circuit board in prior-art.
Figure 3B:
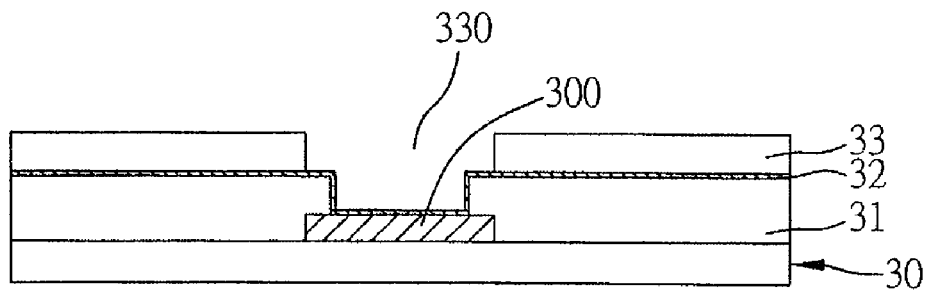
Figure 3C:
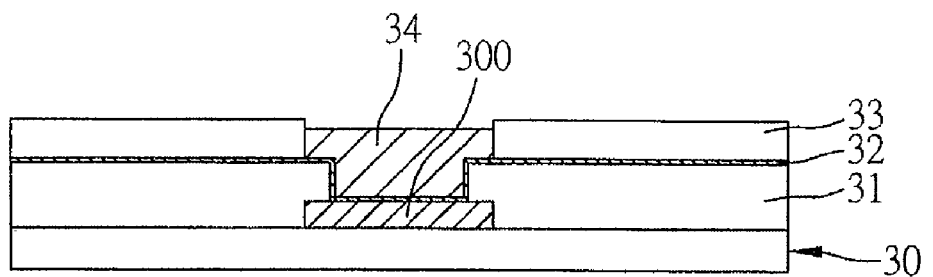
Figure 3D:
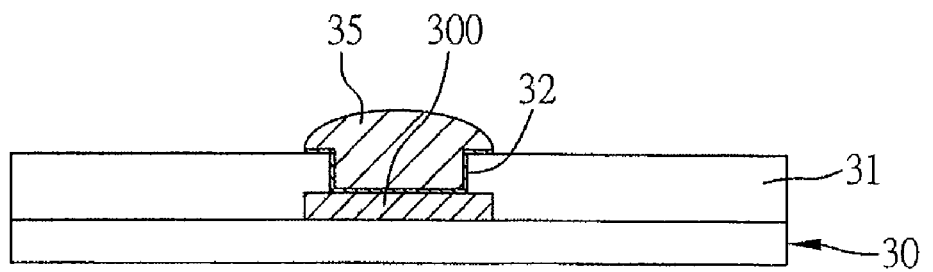
Figure 4A:
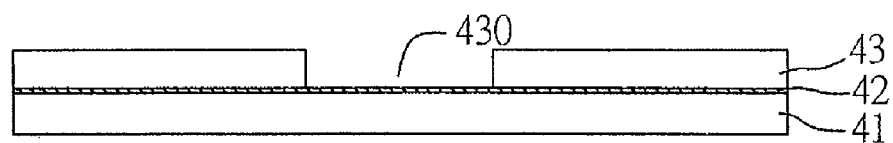
FIGS. 4A to 4I are cross-sectional schematic diagrams of a conductive bump structure of the circuit board in accordance with a first exemplary embodiment of the present invention.
Figure 4B:
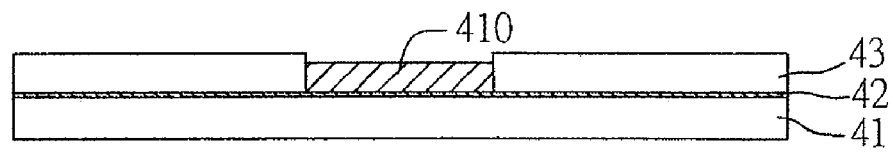
Figure 4C:
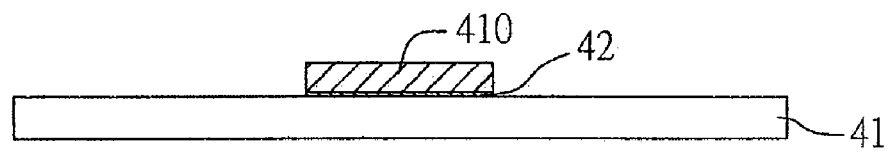

Referring to FIG. 4A-4C, a surface of a circuit board formed with a plurality of electrical connection pads is provided first. The fabrication of forming an electrical connection pad on a surface of a circuit board is further described as follows. As shown in FIG. 4A, a conductive layer 42 is formed on an insulating layer 41, which is formed on a surface of the circuit board, and a resist layer 43 is formed on the conductive layer 42, wherein a plurality of openings 430 are formed in the resist layer 43. In one embodiment, the conductive layer 42 may serve as an electrical conductive pathway for electroplating metal materials employed in subsequent processes, and be made of metals, multi-deposited metal layers, or any conductive molecule material such as conductive polymer, polyacetylene, polyaniline, organosulfur or organosulfide polymer and the like. The resist layer 43 may be a photo-resist layer such as a dry film photo-resist or a liquid photo-resist layer. The resist layer 43 is applied to the surface of the conductive layer 42 by performing process such as printing, spin-coating, laminating, adhering or the like. Then exposure and developing is preformed for patterning the resist layer 43, so that openings 430 are formed in the resist layer 43 to expose a portion of the conductive layer 42 of the surface of the circuit board.

As shown in FIG. 4B, an electroplating process is preformed. During the electroplating process, the conductive layer 42 served as an electrical conductive pathway, for example, a current transmission pathway, allows the electrical connection pads 410 to be formed in the openings 430 of the resist layer 43 via electroplating. Further, conductive wirings may also be formed on the surface of the circuit board simultaneously via electroplating (not shown). As shown in FIG. 4C, the resist layer and the conductive layer 42 covered by the resist layer 43 are removed.

Figure 4D:
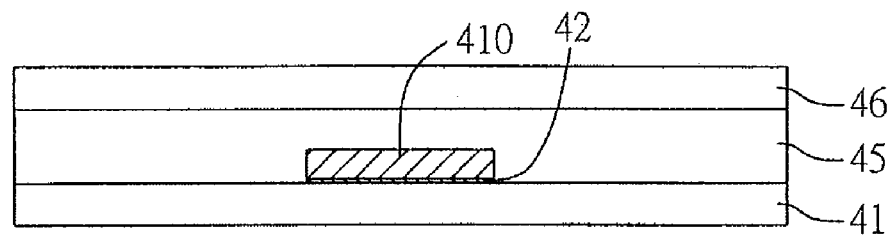
Figure 4E:
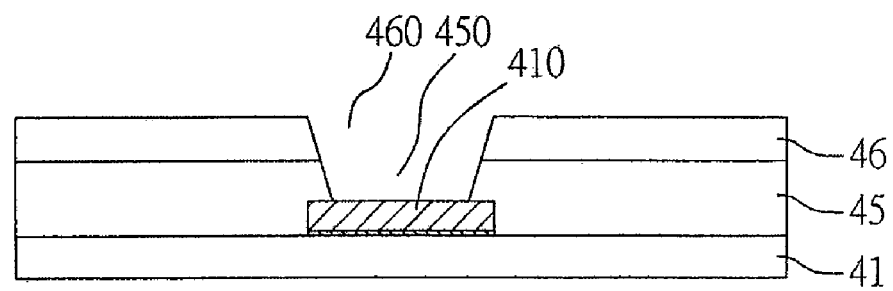

As shown in FIG. 4D, an insulating protective layer 45 is formed on the circuit board comprising the electrical connection pads 410, and then a resist layer 46 is formed on the insulating protective layer 45. In the embodiment, the insulating protective layer 45 and the resist layer 46 are formed on the surface of the circuit board in sequence by performing at least one of printing, coating, spin-coating, laminating, and adhering processes. The insulating protective layer 45 may be a mask layer and the resist layer 46 may be a photo-resist layer such as dry film photo-resist or liquid photo-resist, or a non-photosensitive layer Referring to FIG. 4E, openings 450, 460 are formed on the insulating protective layer 45 and the resist layer 46 at positions corresponding to the electrical connection pads 410 to expose the electrical connection pads 410. Further, the openings 450, 460 may be formed by plasma etching or laser etching.

Figure 4F:
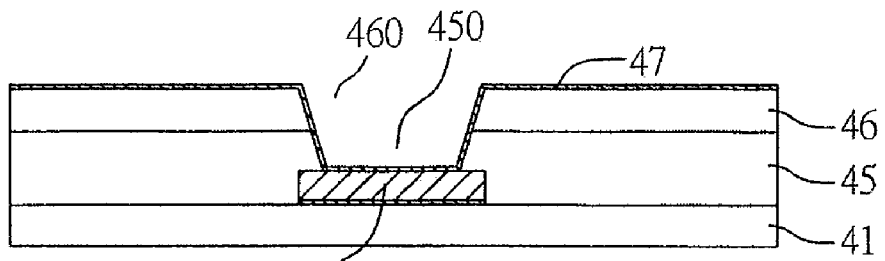

Referring to FIG. 4F, a conductive layer 47 is formed on surfaces of the resist layer 46 and the openings 450, 460. The conductive layer 47 serves as an electrical conductive pathway for electroplating metal materials in subsequent processes, and may be made of metals, alloys, stacked metal layers, or any conductive molecule material such as conductive polymers.

Figure 4G:
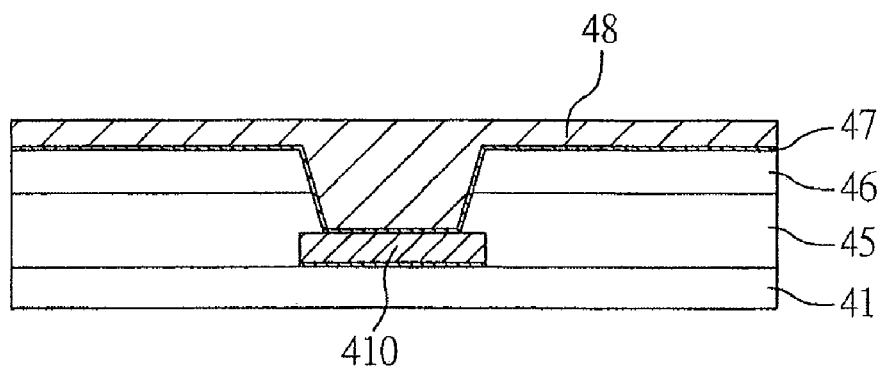

Referring to FIG. 4G, an electroplating process is performed. The conductive layer 47 served as an electrical conductive pathway, provides a large surface area for electroplating. A metal layer 48 is thus formed on the conductive layer 47 via electroplating, wherein the openings 450, 460 of the insulating protective layer 45 and the resist layer 46 are filled with the metal layer 48. Further, the metal layer 48 may be made of metals such as lead (Pb), tin (Sn), silver (Ag), copper (Cu), or their alloys. However, based on the implementation experience, the metal layer 48 is preferably made of, but not limit to, copper via electroplating, because the copper is a well-known electroplating material with a lower material cost.

Figure 4H:
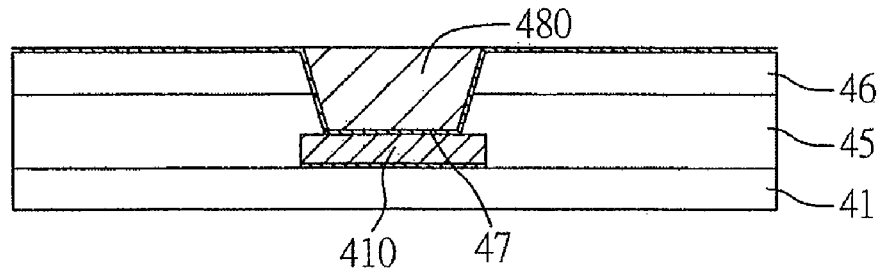

Referring to FIG. 4H, a thinning process is performed to remove the conductive layer 47 and the metal layer 48 formed on the surface of the resist layer 46. Thus, the parts of the metal layer 48 and the conductive layer 47 formed at the position corresponding to the electrical connection pad 410 and filled in the opening 450 of the insulating protective layer and the opening 460 of the resist layer are retained, in order to form metal bumps 480 comprising the metal layer 48 and the conductive layer 47 at even height. The thinning process may include, but not limited to, etching or abrading process.

Figure 4I:
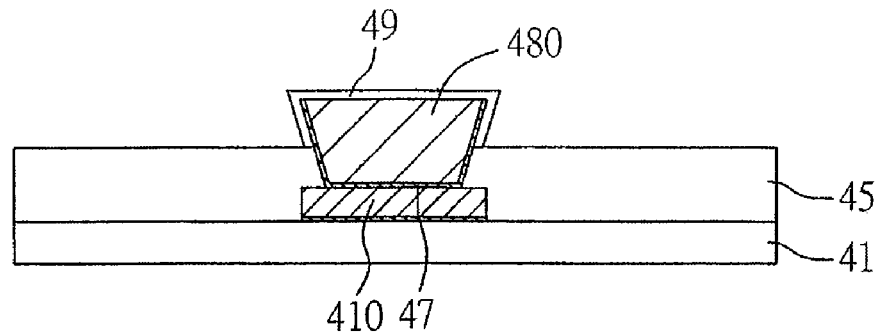

Referring to FIG. 4I, the resist layer 46 is moved by chemical means such as etching or physical means such as tearing, and an adhesive layer 49 is formed on the exposed surfaces of the metal bump 480. Further, the material of the adhesive layer 49 may be selected from, but not limited to, at least one of the group consisting of copper (Cu), tin (Sn), lead (Pb), silver (Ag), nickel (Ni), gold (Au), platinum (Pt), their alloys, solder materials, and an organic solderability preservative (OSP), so as to form the conductive bumps 480 for electrically connecting the circuit board to a semiconductor chip of an electronic devices.

Referring to the aforementioned fabricating methods, a conductive bump structure of the circuit board fabricated in accordance with present invention is provided, wherein a surface of the circuit board is formed with an electrical connection pad 410 and covered by an insulating protective layer 45, an opening 450 is formed in the insulating protective layer 45 to expose the electrical connection pad 410 covered by the insulating protective layer 45 and the conductive bump structure is formed on the electrical connection pad 410 of the circuit board and protruded from the opening 450 of the insulating protective layer. Further, the conductive bump structure comprises a metal bump 480 having a metal layer 48 and a conductive layer 47 formed on the lateral and bottom sides of the metal layer 48, wherein the metal bump 48 is protruded from the opening of the insulating layer 41; and an adhesive layer 49 covering the exposed surface of the metal bump 480.

Therefore, in one embodiment, according to a conductive bump structure of the circuit board and a method for fabricating the same provided in the present invention, an insulating layer 45 and a resist layer 46 with openings 450, 460 are formed on a surface of the circuit board, wherein the openings 450, 460 are formed at positions corresponding to electrical connection pads 410, so that the electrical connection pads 410 are exposed. Then a conductive layer 47 is formed on the surfaces of the openings 450, 460 and resist layer 46. This thereby allows the conductive layer 47 with larger surface area to provide a sufficiently large area for subsequent electroplating process and form a metal layer 48 on the conductive layer 47 by electroplating. Later, portions of the metal layer 48 and the conductive layer 47 formed on a surface of the resist layer 46 are removed, so as to reduce the difficulty of electroplating increased due to minimal area for electroplating. Further, the metal layer 48 is filled in the openings 450, 460, and portions of the metal layer 48 and conductive layer 47 are removed to form the metal bumps 480 of even height, so as to avoid problems like forming uneven height of conductive bumps on the surface of circuit board, which is incurred as a result of directly forming the metal bumps in the openings of the insulating protective layer and the resist layer by electroplating and will have a serious impact on the reliability of the electrical connecting process of circuit boards and the external electronic component.

Moreover, in accordance with a conductive bump structure of the circuit board and a method for fabricating the same provided in the present invention, the conductive layer 47 is formed on surfaces of the electrical connection pads 410 first, and then the metal layer 48 is formed on the conductive layer 47 of larger surface area via electroplating. Accordingly, the metal layer 48 formed on the electrical connection pads 410 via copper electroplating, having a low material cost and faster electroplating speed, is made with copper characteristics. Further, portions of the metal layer 48 and conductive layer 47 are removed to form the metal bumps 480, so as to save the fabrication time. Since a larger surface area of the conductive layer 47 is provided for electroplating, the difficulty of electroplating is thus reduced.

Moreover, the adhesive layer 49 made of solder materials, which is high material cost, is formed on the surfaces of the metal bumps 480, so as to reduce the usage of high cost solder materials to reduce the cost of production. Such adhesive layer 49 also provides strong binding force between the circuit board and the external device. Meanwhile, the present invention could also avoid problems such as bridging effect and short circuit, resulting from using too much solder materials in the conventional solder reflow process; and hence provide the fine-pitch electrical connection pads and solve problems caused by the conventional stencil printing technique, such as size limitation on conductive bumps, restrictions on distances between contact pads or increase of production cost and complexity of fabrication.

FIG. 5A-5G are cross-sectional schematic diagrams of a second preferred embodiment of a conductive bump structure of the circuit board. The fabrication method provided herewith is similar to the one disclosed in the foregoing embodiment; however, in this embodiment, openings are formed in the insulating protective layer before the resist layer. Later, openings of the resist layer are formed at positions corresponding to electrical connection pads for subsequent electroplating process.

Figure 5A:
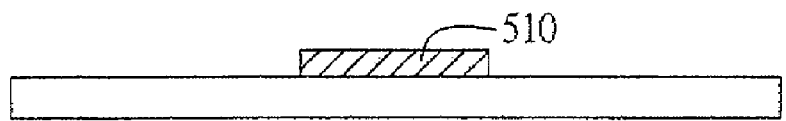
FIGS. 5A to 5G are cross-sectional schematic diagrams of a conductive bump structure of the circuit board in accordance with a second exemplary embodiment of the present invention.

Referring to FIG. 5A, a circuit board 50 having a surface formed with a plurality of electrical connection pads 510 is provided.

Figure 5B:
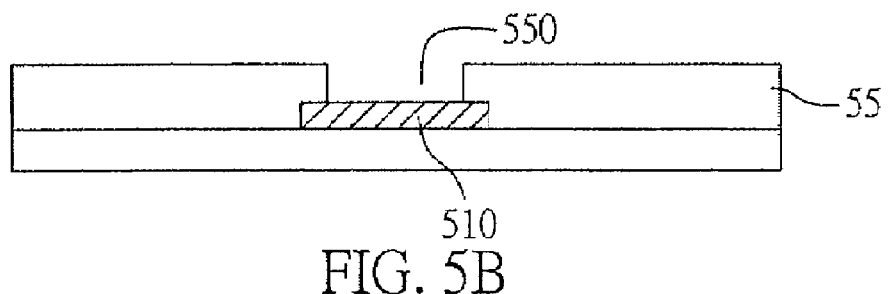

Referring to FIG. 5B, the surface of the circuit board 50 is covered by an insulating protective layer 55, wherein the insulating protective layer 55 is formed with a plurality of openings 550, so that the electrical connection pads 510 are exposed from the insulating protective layer 55.

Figure 5C:
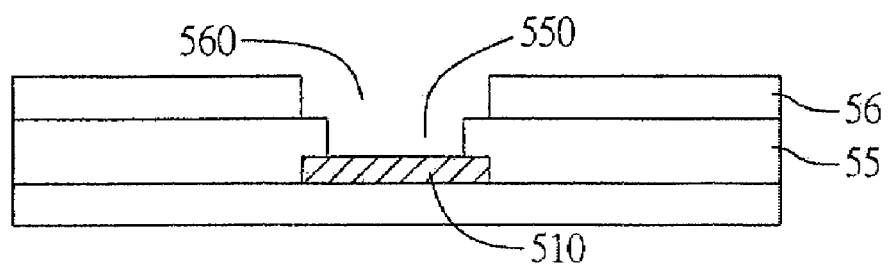

Referring to FIG. 5C, a resist layer 56 is formed on the insulating protective layer 55, wherein openings 560 are formed on the resist layer 56 at positions corresponding to the openings 550 of the insulating protective layer 55 via exposure and developing, so as to expose the electrical connection pads 510 formed on the surface of the circuit board 50.

Figure 5D:
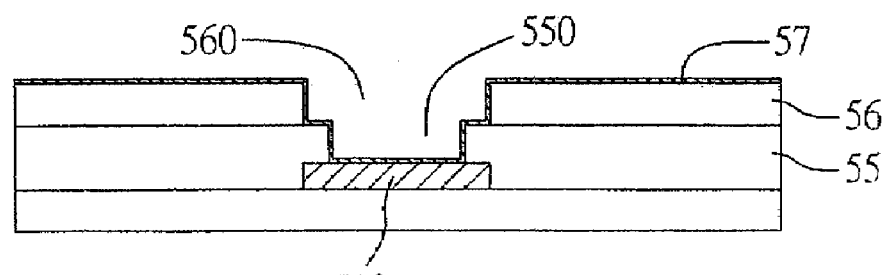

Referring to FIG. 5D, a conductive layer 57 is formed on surfaces of the resist layer 56 and openings 550, 560.

Figure 5E:
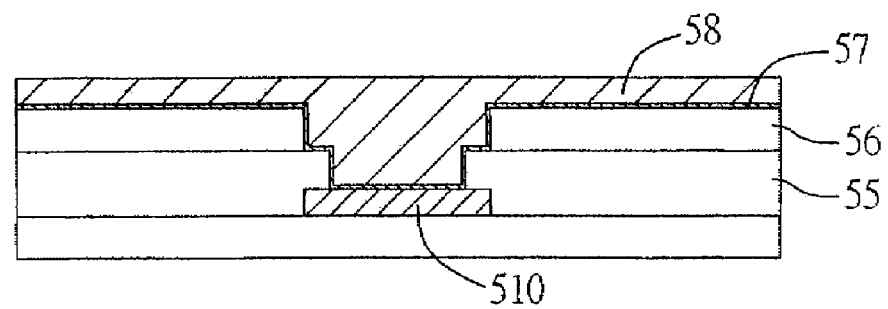

Referring to FIG. 5E, an electroplating process is performed. The conductive layer 57 serves as an electrical conductive pathway and provides a large surface area for electroplating. Later, a metal layer 58 is formed on the conductive layer 57 via electroplating, wherein the metal layer 58 is filled in the openings 550, 560 of the insulating protective layer 55 and resist layer 56.

Figure 5F:
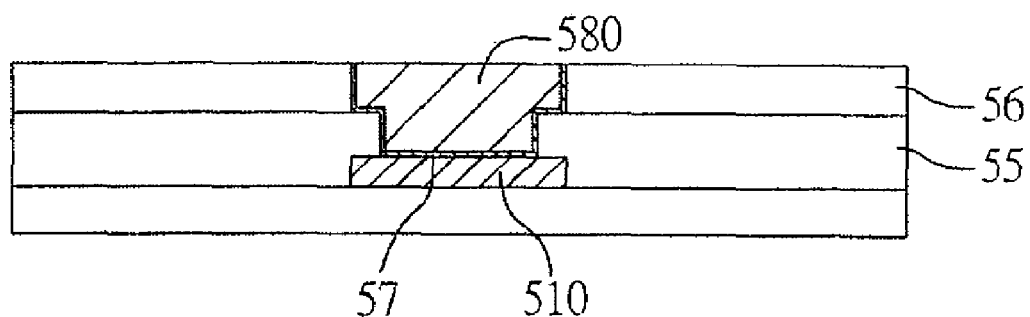

Referring to FIG. 5F, a thinning process is performed to remove portions of the conductive layer 57 and metal layer 58 formed on the surface of the resist layer 56. However, the conductive layer 57 and the metal layer 58 formed in the openings 550, 560 are retained, so as to form even height of metal bumps 580 comprising portions of the metal layer 58 and the conductive layer 57 on the electrical connection pads 510 of the circuit board 50. What is more is that, in the embodiment, the metal layer 58 and the conductive layer 57 on the surface of the resist layer 56 are removed via thinning, and the metal layer 58 and the conductive layer 47 which are formed at a position corresponding to the electrical connection pad 510 formed on the surface of the circuit board and filled in the openings 560,550 of the resist layer and the insulating protective layer are retained, in order to form the metal bumps 580 of even height on the electrical connection pads 510 to provide a flat surface for forming subsequent electrical connection with the external device. Further, the thinning process may be, but not limited to, etching or abrading process.

Figure 5G:
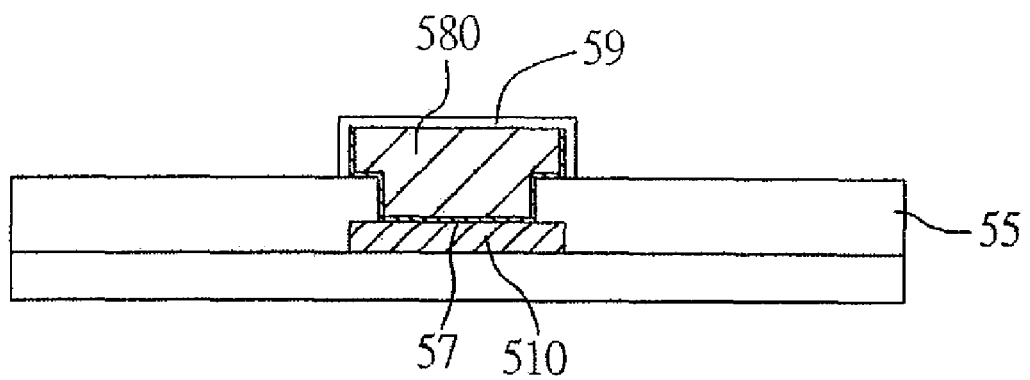

Referring to FIG. 5G, subsequently, the resist layer 56 is moved by chemical means such as etching or physical means such as tearing, so as to form an adhesive layer 59 on the exposed surface areas of the metal bump 580.

FIG. 6A-6G are cross-sectional schematic views of a third preferred embodiment of conductive bump structures of a circuit board. The fabrication method provided herewith is similar to the one disclosed in the second embodiment; however, in this embodiment, a resist layer, a metal layer and a conductive layer formed on a surface of the resist layer are removed at once, so as to form the conductive bumps on the electrical connection pads of the circuit board.

Figure 6A:
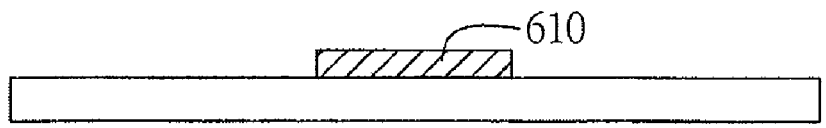
FIGS. 6A to 6G are cross-sectional schematic diagrams of a conductive bump structure of the circuit board in accordance with a third exemplary embodiment of the present invention.

Referring to FIG. 6A, a circuit board 60 having a surface formed with a plurality of electrical connection pads 610 is provided.

Figure 6B:
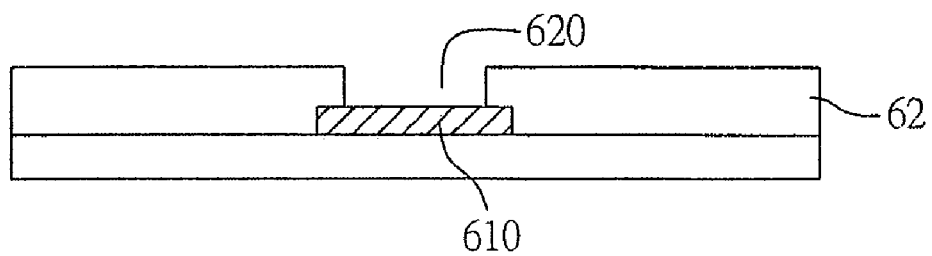

Referring to FIG. 6B, the surface of the circuit board 60 is covered by an insulating protective layer 62, wherein the insulating protective layer 62 is formed with a plurality of openings 630 to expose the electrical connection pads 610 of the circuit board 60.

Figure 6C:
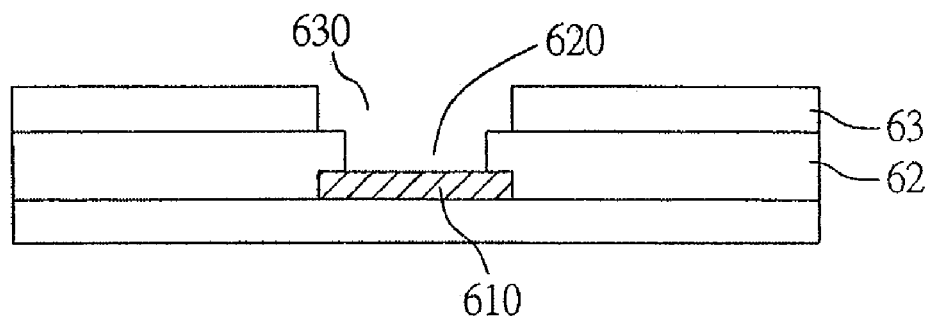

Referring to FIG. 6C, a resist layer 63 is formed on the insulating protective layer 62, wherein openings 630 are formed in the resist layer 63 at positions corresponding to the openings 620 of the insulating protective layer 62 via exposure and developing, so as to expose the electrical connection pads 610 formed on the surface of the circuit board 60.

Figure 6D:
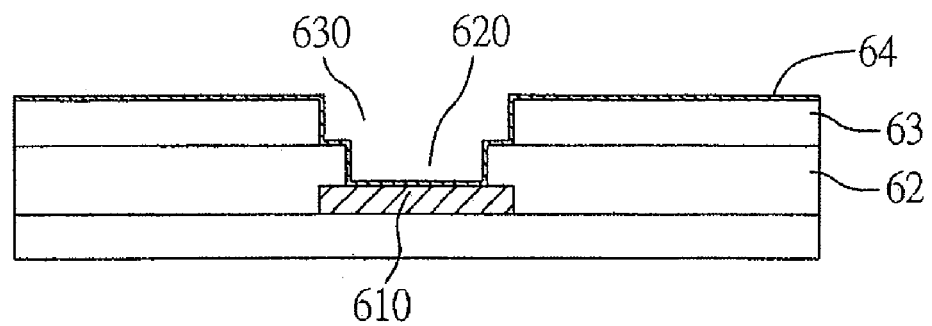

Referring to FIG. 6D, a conductive layer 64 is formed on surfaces of the resist layer 63 and the openings 620, 630.

Figure 6E:
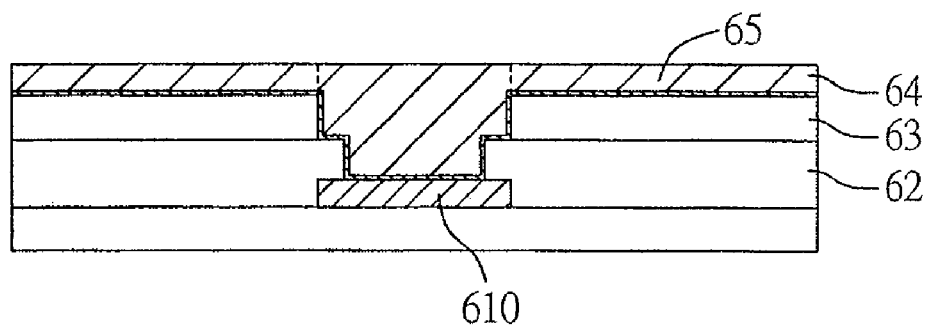

Referring to FIG. 6E, an electroplating process is performed. The conductive layer 64 serves as an electrical conductive pathway and provides a large surface area for electroplating Later, a metal layer 65 is thus formed on the conductive layer 64 via electroplating, wherein metal layer 65 is filled in the openings 620, 630 of the insulating protective layer 62 and resist layer 63.

Figure 6F:
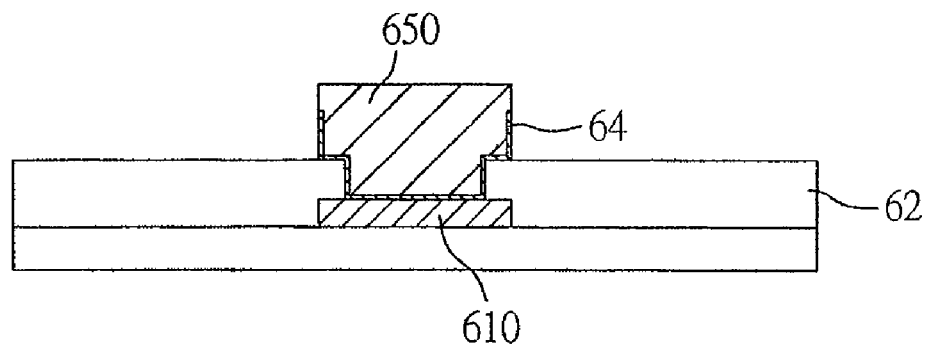

Referring to FIG. 6F, the resist layer 63 is moved by physical means such as tearing. Due to the tearing force applied to the resist layer 63, a stress concentration effect occurs around the openings 620 of the resist layer 63, and thereby allows the conductive layer 64 and metal layer 65 to be removed simultaneously along with the removal of the resist layer 63, so as to form metal bumps 650 with even height on the electrical connection pads 610. Arrangement as such provides a fairly flat surface for connecting the circuit boards to the external electronic components (including semiconductor chips) in subsequent process.

Figure 6G:
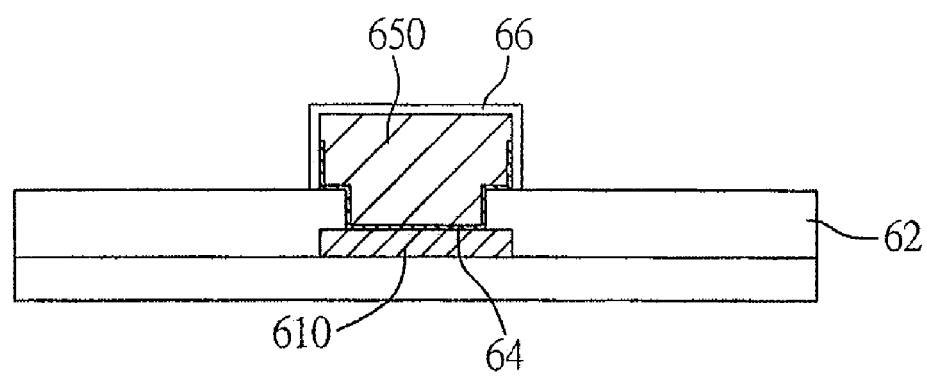

Referring to FIG. 6G, an adhesive layer 66 is formed over the metal bumps 650.

Therefore, according to a conductive bump structure of the circuit board and a method for fabricating the same provided in the present invention, an insulating layer and a resist layer with openings are formed on a surface of a circuit board, wherein the openings are corresponding to electrical connection pads, so that the electrical connection pads are exposed. Then a conductive layer is formed on the surfaces of the openings and resist layer. This thereby allows the conductive layer with larger surface area to provide a sufficiently large area for subsequent electroplating process and form a metal layer thereon by electroplating. Later, the metal layer and the conductive layer formed on a surface of the resist layer are removed; however, the metal layer and the conductive layer formed in the openings are retained to form metal bumps on the electrical connection pads of the circuit board, so as to reduce the difficulty of electroplating increased due to minimal area for electroplating. Further, the metal layer is filled in the openings of the insulating protective and the resist layer in order to flatten the surface of the metal layer; and then a portion of the metal layer is removed to form the metal bumps of even height, so as to avoid problems like forming uneven height of conductive bumps on the surface of circuit board, which is incurred as a result of directly forming the metal bumps in the openings of the insulating protective layer and the resist layer by electroplating and will have a serious impact on the reliability of the electrical connecting process of circuit boards and external electronic components (including semiconductor chips).

Moreover, in accordance with a conductive bump structure of the circuit board and a method for fabricating the same provided in the present invention, the conductive layer is formed on surfaces of the electrical connection pads first, and then the metal layer is formed on the conductive layer of larger surface area via electroplating. Accordingly, the metal layer formed on the electrical connection pads via copper electroplating, having a low material cost and faster electroplating speed, is made with copper characteristics to save the fabrication time. Further, the difficulty of electroplating is reduced because of having a larger surface area of the conductive layer for electroplating. As a result, the conductive bump structure of the circuit provided in the present invention could reduce the amount of solder material used and thus reduce the cost of production. Meanwhile, the present invention could also avoid problems such as bridging effect and short circuit, resulting from using too much solder materials in the conventional solder reflow process; and hence provide the fine-pitch electrical connection pads and solve problems caused by the conventional stencil printing technique, such as size limitation on conductive bumps, restrictions on distances between contact pads or increase of production cost and complexity of fabrication.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for fabricating a conductive bump structure of a circuit board, comprising:
   providing the circuit board having at least a surface formed with a plurality of electrical connection pads;
   forming an insulating protective layer and a resist layer on the circuit board in sequence;
   forming a plurality of openings in the insulating protective layer and resist layer at positions corresponding to the electrical connection pads to expose the electrical connection pads of the circuit board;
   forming a conductive layer on surfaces of the resist layer and openings;
   forming a metal layer on the conductive layer via electroplating to fill metal in the openings of the insulating protective layer and the resist layer;
   removing the metal layer and conductive layer formed on the surface of the resist layer via thinning, and retaining the metal layer and conductive layer filled in the openings to form metal bumps on the electrical connection pads; and
   removing the resist layer, and forming an adhesive layer over exposed surfaces of the metal bumps, so as to form the conductive bump structure for electrically connecting the circuit board to an external electronic component.

2. The method for fabricating a conductive bump structure of a circuit board of claim 1, wherein the method for fabricating the electrical connection pads comprises:
   forming a conductive layer on an insulating layer formed on a surface of the circuit board;
   forming a resist layer on the conductive layer, and forming openings in the resist layer to expose a portion of the conductive layer; and
   forming the electrical connection pads in the openings of the resist layer via electroplating.

3. The method for fabricating a conductive bump structure of a circuit board of claim 2, further comprising removing the resist layer and the conductive layer covered by the resist layer.

4. The method for fabricating a conductive bump structure of a circuit board of claim 1, wherein the openings of the insulating protective layer and the resist layer are formed via plasma etching or laser drilling.

5. The method for fabricating a conductive bump structure of a circuit board of claim 1, wherein the metal bumps are made of the metal layer and the conductive layer formed at positions corresponding to the electrical connection pads.

6. The method for fabricating a conductive bump structure of a circuit board of claim 1, wherein the adhesive layer is an organic solderability preservative.

7. The method for fabricating a conductive bump structure of a circuit board of claim 1, wherein the adhesive layer is made of a material selected from the group consisting of copper (Cu), tin (Sn), lead (Pb), silver (Ag), nickel (Ni), gold (Au), platinum (Pt) and their alloys.

8. The method for fabricating a conductive bump structure of a circuit board of claim 1, wherein the metal layer is made of a material selected from the group consisting of copper (Cu), tin (Sn), lead (Pb), silver (Ag), and their alloys.

9. The method for fabricating a conductive bump structure of a circuit board of claim 1, wherein the tinning process is one of etching or abrading.

10. The method for fabricating a conductive bump structure of a circuit board of claim 1, wherein the resist layer is removed via chemical stripping or physical tearing.

11. A method for fabricating a conductive bump structure of a circuit board, comprising:
    providing the circuit board having at least a surface formed with a plurality of electrical connection pads;
    forming an insulating protective layer on the circuit board in sequence, and forming a plurality of openings in the insulating protective layer to expose the electrical connection pads of the circuit board;
    forming a resist layer on the insulating protective layer, and forming a plurality of openings in the resist layer at positions corresponding to the openings of the insulating protective layer to expose the electrical connection pads;
    forming a conductive layer on exposed surfaces of the resist layer and openings;
    forming a metal layer on the conductive layer via electroplating to fill metal in the openings;
    removing the resist layer, the conductive layer and metal layer formed on the surface of the resist layer to form metal bumps on the electrical connection pads of the circuit board, wherein the metal bumps comprise the metal layer and conductive layer; and
    forming an adhesive layer over exposed surfaces of the metal bumps.

12. The method for fabricating a conductive bump structure of a circuit board of claim 11, wherein the method for fabricating the electrical connection pads comprises:
    forming a conductive layer on an insulating layer formed on a surface of the circuit board;
    forming a resist layer on the conductive layer, and forming openings of the resist layer to expose a portion of the conductive layer; and
    forming the electrical connection pads in the openings of the resist layer via electroplating.

13. The method for fabricating a conductive bump structure of a circuit board of claim 12, further comprising removing the resist layer and the conductive layer covered by the resist layer.

14. The method for fabricating a conductive bump structure of a circuit board of claim 11, wherein the process of removing the resist layer and conductive layer covered by the resist layer is to remove the metal layer and conductive layer formed on the surface of the resist layer first via thinning and retain the metal layer and conductive layer filled in the openings.

15. The method for fabricating a conductive bump structure of a circuit board of claim 11, wherein the process of removing the resist layer and the conductive layer covered by the resist layer is to remove the resist layer, the metal layer and conductive layer formed on the surface of the resist layer first via physical methods.

16. The method for fabricating a conductive bump structure of a circuit board of claim 11, wherein the adhesive layer is made of a material selected from the group consisting of copper (Cu), tin (Sn), lead (Pb), silver (Ag), nickel (Ni), gold (Au), platinum (Pt) and their alloys.

17. The method for fabricating a conductive bump structure of a circuit board of claim 11, wherein the adhesive layer is an organic solderability preservative.

18. The method for fabricating a conductive bump structure of a circuit board of claim 11, wherein the metal layer is made of a material selected from the group consisting of copper (Cu), tin (Sn), lead (Pb), silver (Ag), and their alloys.

19. The method for fabricating a conductive bump structure of a circuit board of claim 11, wherein the openings of the insulating protective layer and the resist layer are formed by a patterning process, and the patterning process is exposure and developing or laser formation.

* * * * *